US008665597B2

(12) United States Patent
Lee

(10) Patent No.: US 8,665,597 B2
(45) Date of Patent: Mar. 4, 2014

(54) TUBE

(75) Inventor: Tsung-Chi Lee, New Taipei (TW)

(73) Assignees: Lite-On Electronics (Guangzhou) Limited, Guangzhou (CN); Lite-On Technology Corporation, Taipei (TW)

( * ) Notice: Subject to any disclaimer, the term of this patent is extended or adjusted under 35 U.S.C. 154(b) by 119 days.

(21) Appl. No.: 13/452,802

(22) Filed: Apr. 20, 2012

(65) Prior Publication Data

US 2012/0300409 A1 Nov. 29, 2012

(30) Foreign Application Priority Data

May 24, 2011 (CN) .......................... 2011 1 0134286

(51) Int. Cl.
*H05K 7/20* (2006.01)
*F21V 29/00* (2006.01)

(52) U.S. Cl.
USPC ........... 361/704; 361/708; 361/715; 361/721; 362/249.02; 362/294; 362/382

(58) Field of Classification Search
USPC .......................................................... 361/715
See application file for complete search history.

(56) References Cited

U.S. PATENT DOCUMENTS

| | | | | | |
|---|---|---|---|---|---|
| 4,400,858 | A * | 8/1983 | Goiffon et al. | 24/546 |
| 4,547,833 | A * | 10/1985 | Sharp | 361/716 |
| 4,855,870 | A * | 8/1989 | Russell et al. | 361/739 |
| 8,167,466 | B2 * | 5/2012 | Liu | 362/373 |
| 8,408,742 | B2 * | 4/2013 | Tran | 362/249.02 |
| 2009/0219713 | A1 * | 9/2009 | Siemiet et al. | 362/218 |
| 2011/0305024 | A1 * | 12/2011 | Chang | 362/294 |
| 2012/0026729 | A1 * | 2/2012 | Sanchez et al. | 362/218 |
| 2012/0051039 | A1 * | 3/2012 | Chang | 362/218 |
| 2013/0058082 | A1 * | 3/2013 | Hirsh et al. | 362/235 |

* cited by examiner

*Primary Examiner* — Gregory Thompson
(74) *Attorney, Agent, or Firm* — Li & Cai Intellectual Property (USA) Office

(57) ABSTRACT

A tube includes a tube body and a heat-dissipating member. A light-emitting module and a first electronic component connected electrically to the light-emitting module are disposed in the tube body. At least one opening is formed on the tube body in correspondence to the first electronic component. The heat-dissipating member is placed over the opening. The heat-dissipating member provides a first heat-dissipating path for the first electronic component.

20 Claims, 8 Drawing Sheets

TUBE

BACKGROUND OF THE INVENTION

1. Field of the Invention

The present invention relates to a tube; more particularly to a tube having multiple heat-dissipating paths.

2. Description of Related Art

By being environmental friendly and having low power consumption, the light-emitting diodes (LEDs) are gradually being used in lighting applications. For example, the LED tube has already been introduced to replace the conventional fluorescent lamp. The goal is to integrate the LEDs into every-day household and office lighting applications.

The LED tube is very temperature-sensitive. Generally speaking, the junction temperature ($T_j$) of an LED must be kept below 125 deg. Celsius to prevent malfunction. This criterion is essential to prevent the LED tube from malfunctioning. In addition, a temperature gradient usually exists along the tube shaft direction of the LED tube. This temperature gradient can cause the LEDs arranged along the tube to exhibit different lighting characteristics with respect to each other, which creates uneven illumination for the LED tube.

The increase in temperature for the LED tube is mainly due to the physical characteristics of the LED itself and the heat generated by the corresponding driving circuit. For example, the temperature of the LED chip would increase when the active layer of the LED chip is excited. Moreover, when in operation, the transformers and resistors of the driving circuit would generate heat as well. The increase in temperature can reduce the service life of the LED tube and cause failures. Also, the appearance of the temperature variation is existed along the tube shaft direction of the LED tube when the LED tube is in operation. This temperature variation is made worse due to the heat generated by the driving circuit. The temperature variation will cause uneven light distribution along the tube shaft direction of the LED tube, which negatively impacts the lighting performance.

SUMMARY OF THE INVENTION

The purpose of the present invention is to provide a tube that can effectively reduce the temperature of the driving circuit. For example, such as by lowering the temperature of a part of the circuitry that generates most heat. Therefore, the temperature variation along the tube shaft direction of the tube can be reduced, so as to protect the lighting module in the tube.

For the advantage, heat generated from one or more electronic component of the driving circuit can be effectively dissipated through the multiple heat-dissipating paths created by the heat-dissipating member and the heat-conducting material.

In order to further appreciate the characteristics and technical contents of the present invention, references are hereunder made to the detailed descriptions and appended drawings in connection with the present invention. However, the appended drawings are merely shown for exemplary purposes, rather than being used to restrict the scope of the present invention.

DETAILED DESCRIPTION OF PREFERRED EMBODIMENTS

The present invention provides a tube, which can reduce the temperature of its internal parts without adding too much weight.

Figure 1:
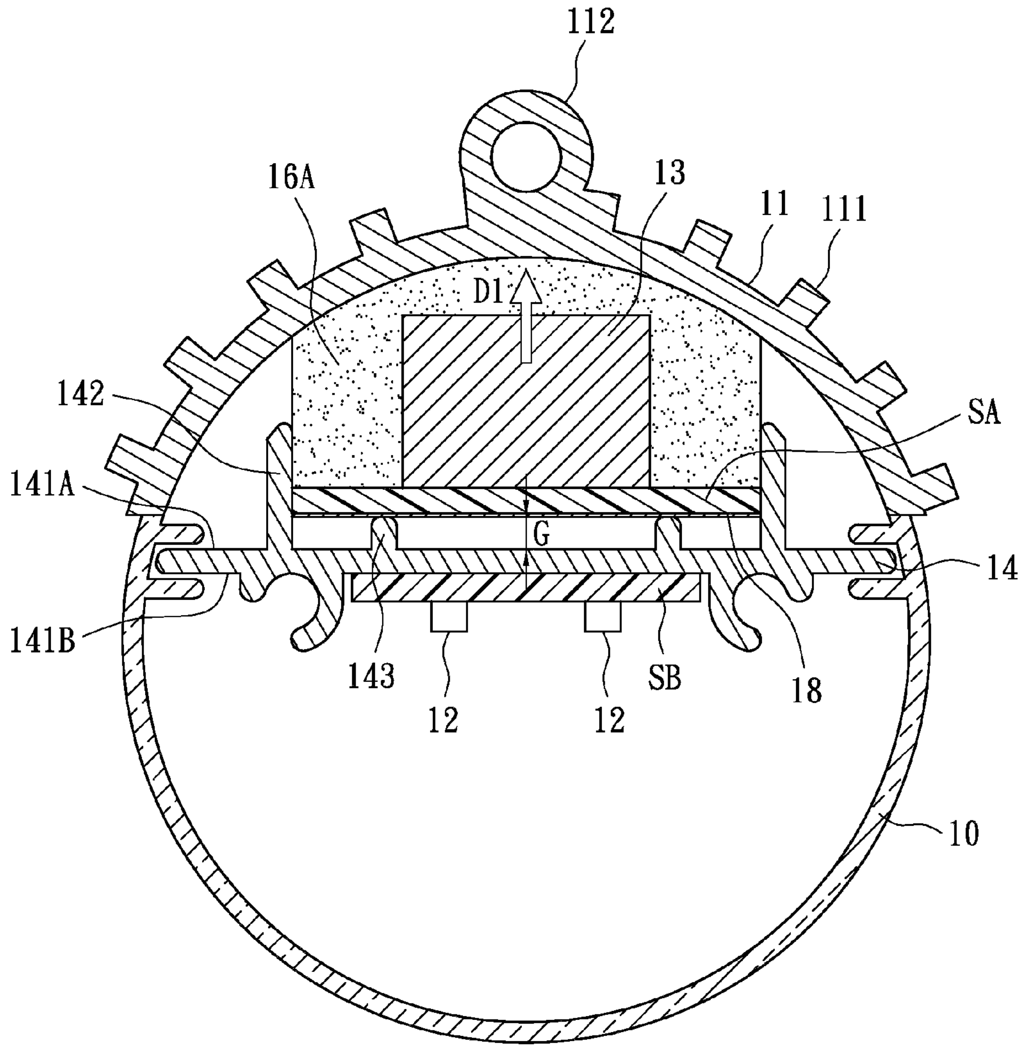
FIG. 1 is a cross-sectional view of a tube for a first embodiment of the present invention.

Please refer to FIG. 1, which shows a tube for a first embodiment of the present invention. The tube comprises a tube body 10 and a heat-dissipating member 11 assembled thereto. The elongated tube body 10 houses a light-emitting module 12 and a first electronic component 13 connected electrically thereto. An opening 101 (see FIG. 2) is formed on the tube body 10 above the first electronic component 13. The opening 101 is occupied by the aforementioned heat-dissipating member 11. The heat-dissipating member 11 may be secured to the opening 101 by latches, fasteners, or any other means. A first heat-conducting material 16A is arranged between the first electronic component 13 and the heat-dissipating member 11. The direct contact between the heat dissipating member 11 and the first heat-conducting material 16A provides a first heat-dissipating path D1 for the first electronic component 13. The first heat-dissipating path D1 is normal to the longitudinal axis of the tube body 10 and is directed toward the opening 101. Therefore, heat generated by the first electronic component 13 can be dissipated effectively to the environment. The opening 101 is sized just enough to expose the first electronic component 13 only, and the heat-dissipating member 11 is designed to match in size with the opening 101. Therefore, the heat-dissipating member 11 of the present invention does not add too much weight for the tube.

A carrier 14 is arranged internally of the tube body 10 to receive the light-emitting module 12, the first electronic component 13, etc. Therefore, the carrier 14 may be served as a heat sink for dissipating heat generated by the light-emitting module 12 and the electronic components. For example, the light-emitting module 12 and the first electronic component 13 can be arranged on opposite surfaces of the carrier 14. With respect to FIG. 1, the carrier 14 has a first surface 141A (top surface) and a second surface 141B (bottom surface) facing oppositely. The first electronic component 13 is mounted on a first circuit board SA on the first surface 141A. More specifically, the first surface 141A has a plurality of positioning members 142 and protruded structures 143 formed thereon. The first circuit board SA is gripped in between the spaced positioning members 142 and supported abuttingly by the protruded structures 143 from underneath. Thereby, a clearance G is formed between the first circuit board SA and the first surface 141A. of the carrier 14. Preferably, an insulating layer 18 is coated on the bottom surface of the first circuit board SA to isolate direct contact from the protruded structures 143 of the carrier 14. A second circuit board SB is arranged on the second surface 141B for mounting the light-emitting module 12. For this embodiment, the first electronic component 13 can be a component of the driving circuit that generates more heat, such as a transformer, and the light-emitting module 12 can be one or more LEDs, but is not restricted thereto.

When the light-emitting module 12 of the tube is driven to an illuminated state, the first electronic component 13 would generate heat in operation. According to the above descriptions, the generated heat would be dissipated to the ambiance through the first heat-dissipating path D1 defined by the heat-dissipating member 11. In addition, the clearance G provides a buffering space where the heat generated from the first electronic component 13 would not have too much influence on the light-emitting module 12. Excessive temperature variations between the LEDs can also be avoided to maintain uniform light distribution.

Furthermore, the heat-dissipating member 11 can be made of a metal with heat-conducting capability, such as by aluminum extrusion method. Preferably, the heat-dissipating member 11 is curved to match the tube body 10 in shape. A plurality of fins 111 and/or a supporting member 112 can be formed on the outer surface of the heat-dissipating member 11. The fins 111 can raise the heat dissipation efficiency of the heat-dissipating member 11. In this embodiment, the supporting member 112 can have a ring-like structure, which can be secured to a tube holder (not shown) or other objects. The supporting member 112 allows the tube body 10 to be supported structurally for preventing physical deformation due to the weight of the tube itself. By the above-described configuration, heat generated by the first electronic component 13 can be dissipated effectively to the environment. The service life of the tube can be extended without adding significant weight.

Figure 2:
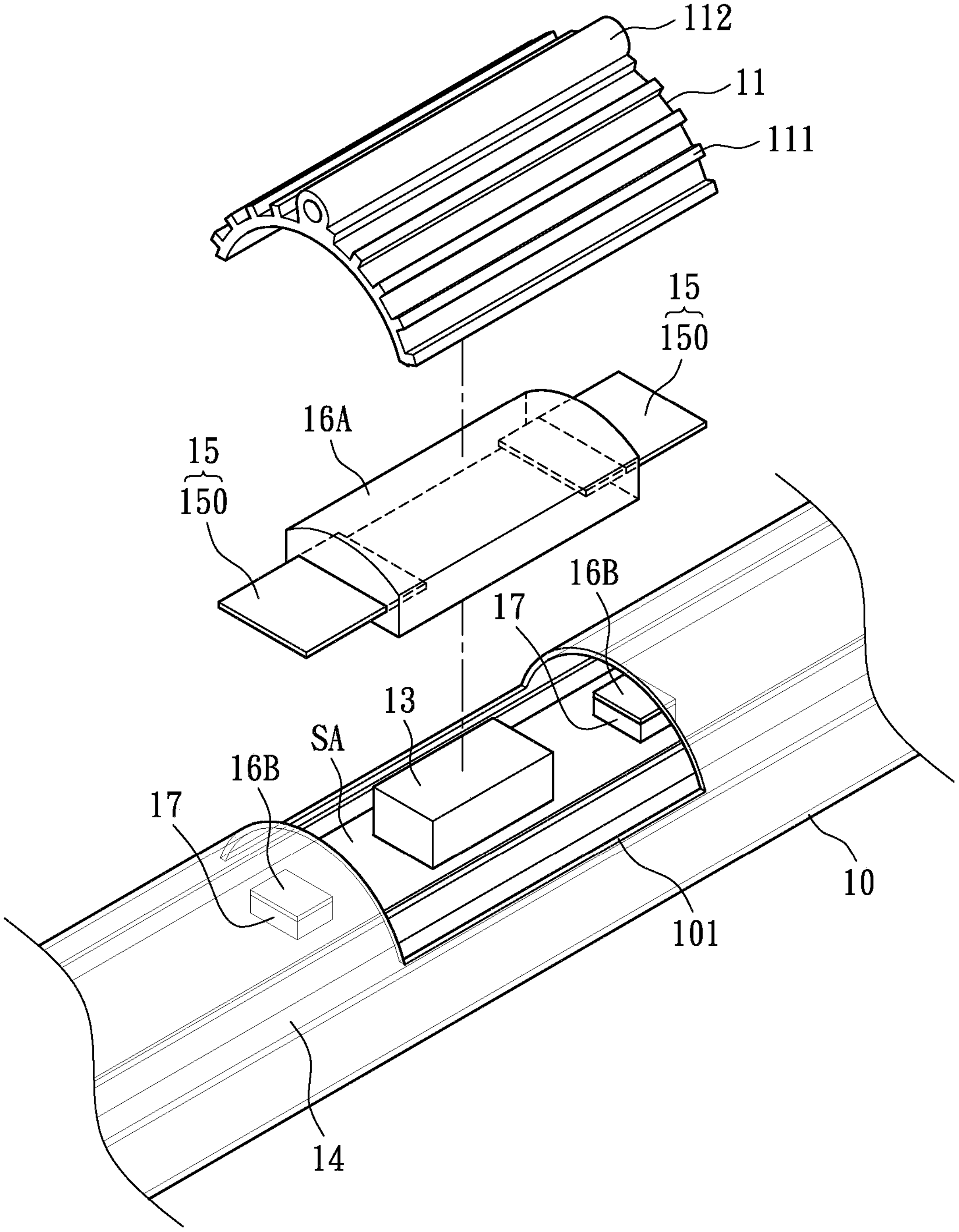
FIG. 2 is an exploded view of a tube for a second embodiment of the present invention.
Figure 2A:
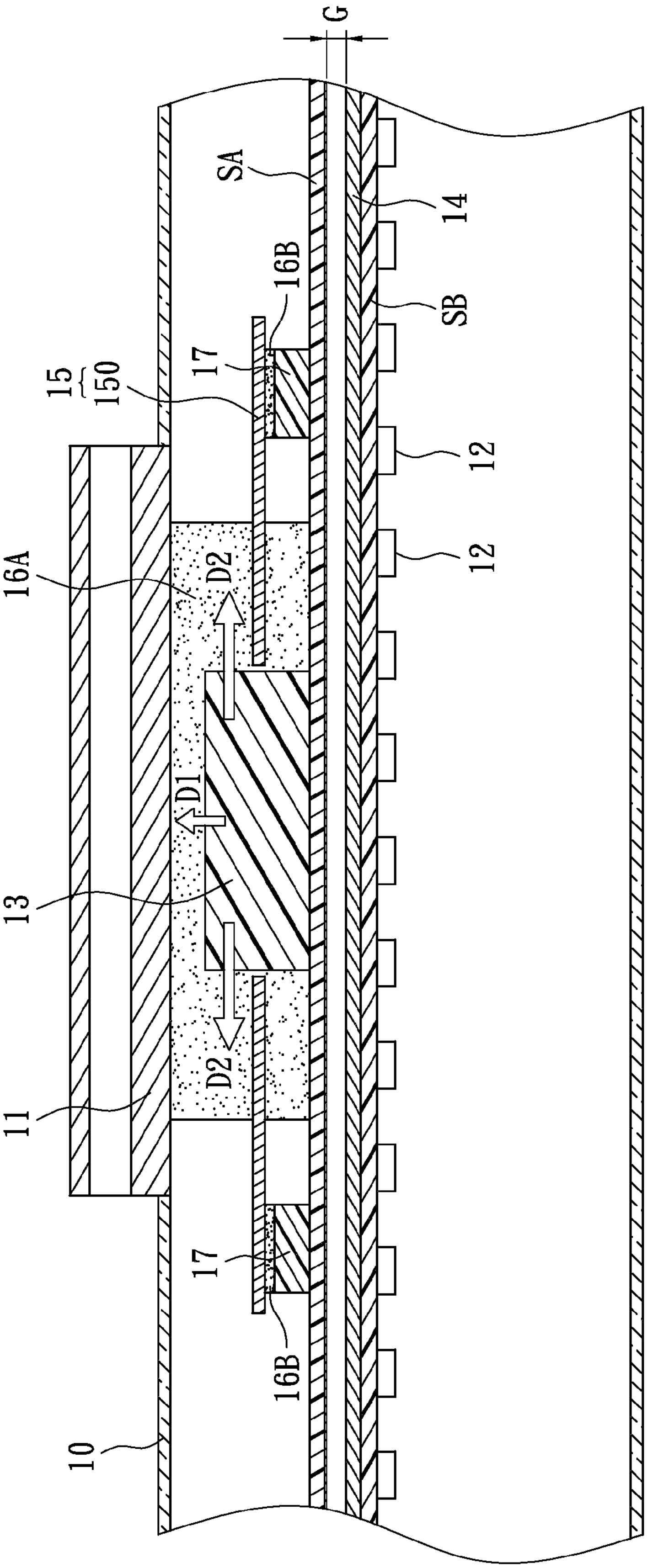
FIG. 2A is a side view of FIG. 2.

Next, please refer to FIGS. 2 and 2A, which show a tube for a second embodiment of the present invention. The figures show the tube further comprises a secondary heat-dissipating member 15 in the proximity of the first electronic component 13 and the first heat-conducting material 16A. The secondary heat-dissipating member 15 includes two metallic strips 150. By using the first heat-conducting material 16A, the two metallic strips 150 are arranged near the opposite ends of the first electronic component 13. The metallic strips 150 can be rectangular-shaped, and are coupled by the first heat-conducting material 16A. More specifically, the first electronic component 13 is arranged in between and under the two metallic strips 150. The metallic strips 150 help to increase the heat-dissipating area for the first electronic component 13, while also help to dissipate heat generated by at least one second electronic component 17. Please note that, the shape of the metallic strips 150 is not restricted but can be varied accordingly. In this embodiment, the first electronic component 13 is coupled to the heat-dissipating member 11 by the first heat-conducting material 16A. The above arrangement forms the first heat-dissipating path D1, which is normal to the longitudinal axis of the tube body 10 and directed toward the opening 101 (please refer to FIG. 1). In addition, the coupling of the first electronic component 13 with the secondary heat-dissipating member 15 by the first heat-conducting material 16A provides a second heat-dissipating path D2. The second heat-dissipating path D2 is parallel to the longitudinal axis of the tube body 10 and directed along the secondary heat-dissipating member 15 in the lengthwise direction (please refer to FIG. 2A). The first and second heat-dissipating paths D1 and D2 of the second embodiment allow the temperature of the first electronic component 13 to be lowered effectively.

In addition, the first circuit board SA has several second electronic components 17, such as capacitors, resistors, MOS switch, etc. These second electronic components 17 are preferably covered by the secondary heat-dissipating member 15. As a coupling, a second heat-conducting material 16B is packed between the second electronic components 17 and the secondary heat-dissipating member 15. Thus, the heat generated by the second electronic components 17 can be dissipated through the heat-dissipating path, which is defined by the secondary heat-dissipating member 15 and the second heat-conducting material 16B. Thereby, temperature variation due to heat aggregation can be avoided. Please note that, the secondary heat-dissipating member 15 is not restricted structurally. To prevent a short circuit, the secondary heat-dissipating member 15 is preferred to be electrically insulated with the first electronic component 13 or the second electronic components 17. Furthermore, each second electronic component 17 can be covered with the second heat-conducting material 16B, as with the first electronic component 13 being coverable with the first heat-conducting material 16A, to provide heat-dissipating path sideways.

Figure 3:
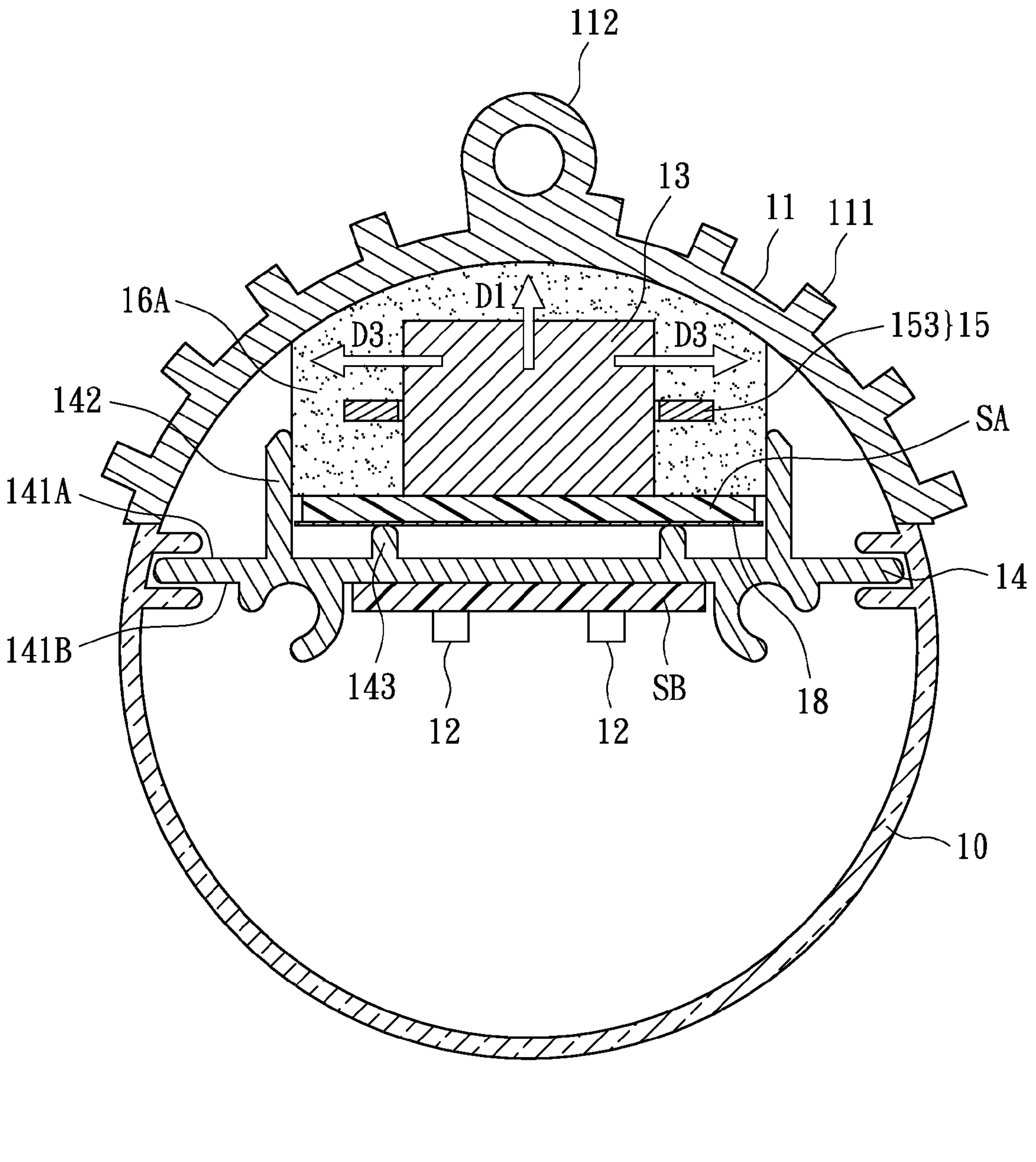
FIG. 3 is a cross-sectional view of a tube for a third embodiment of the present invention.
Figure 3A:
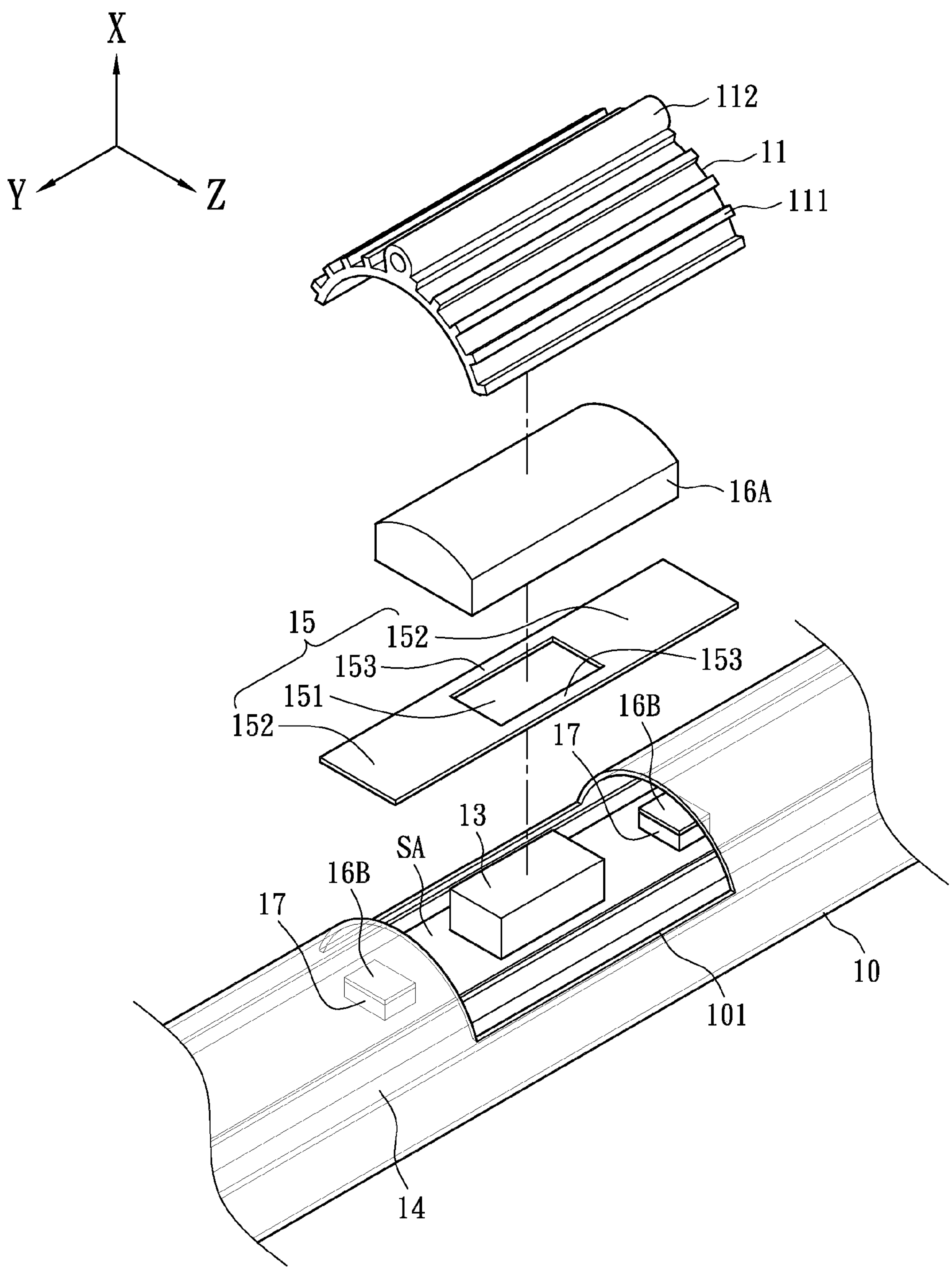
FIG. 3A is an exploded view of FIG. 3.
Figure 3B:
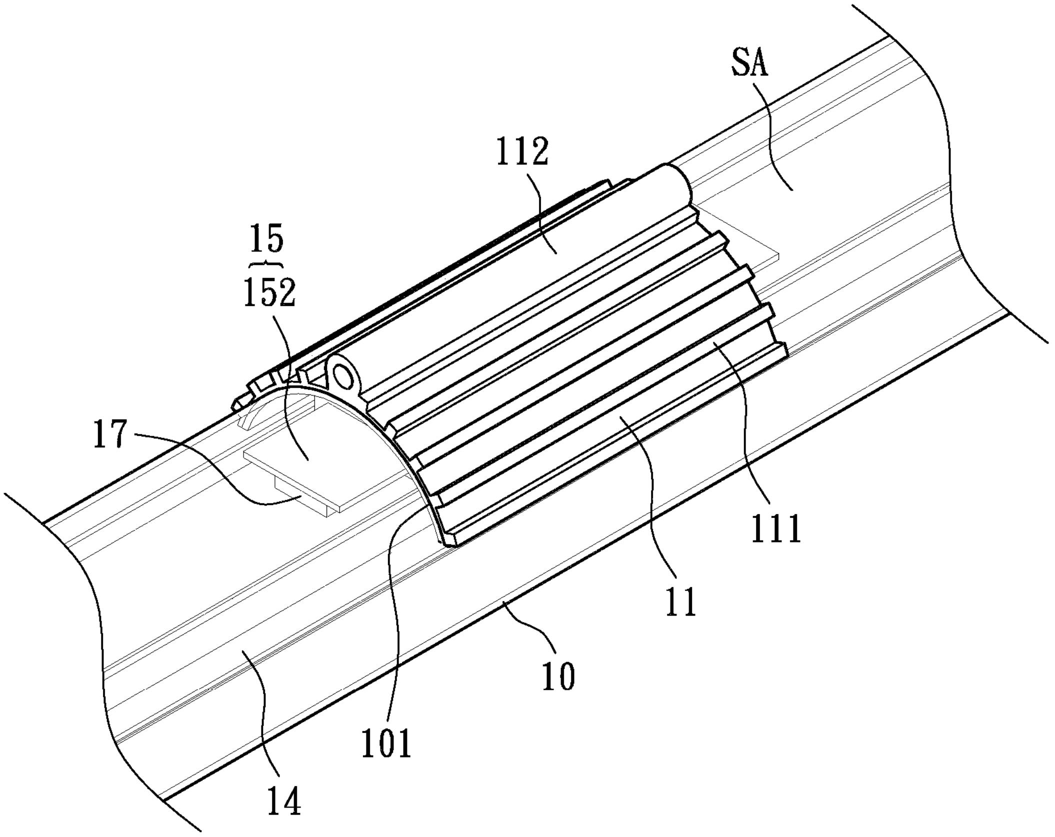
FIG. 3B is an assembled view of FIG. 3A.
Figure 3C:
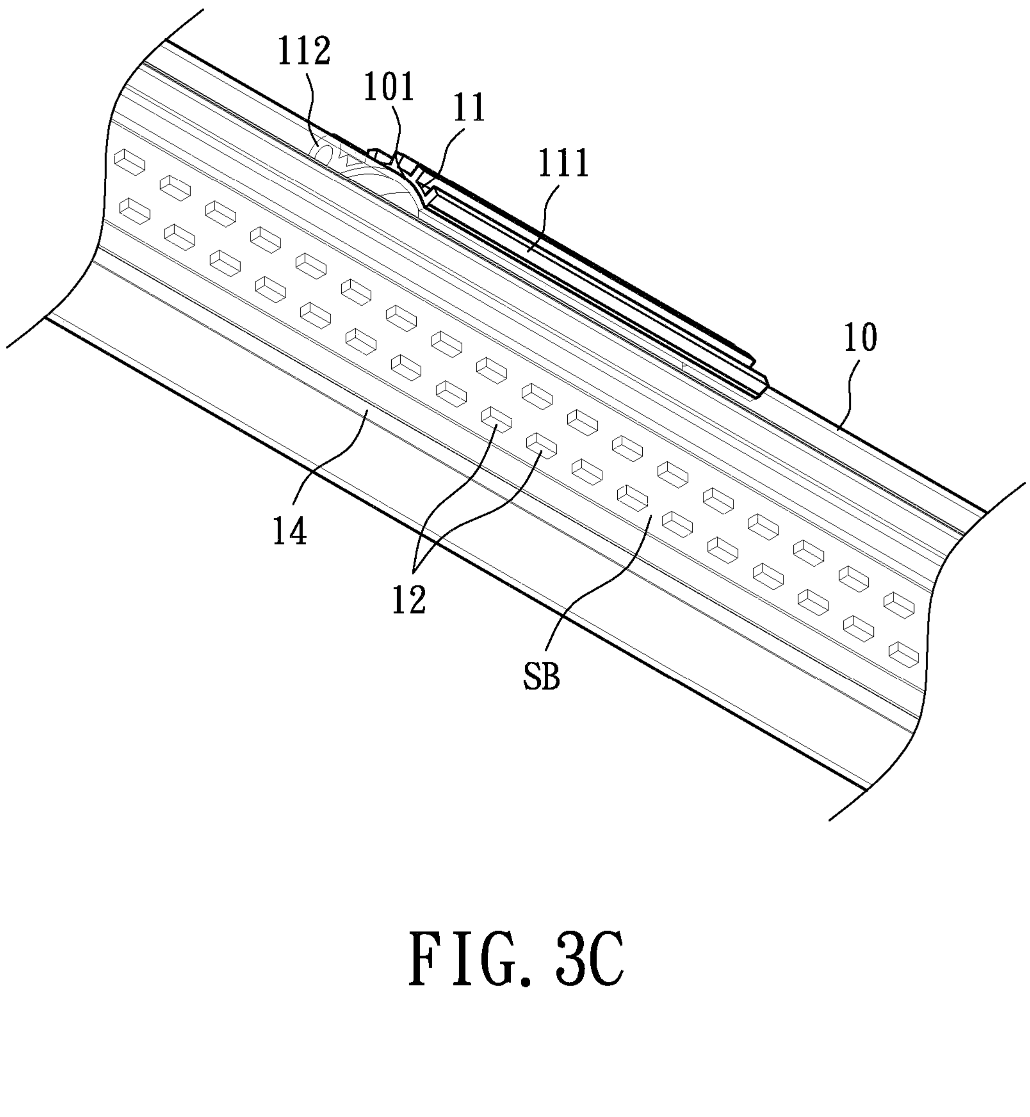
FIG. 3C is another assembled view of FIG. 3A from a different angle.
Figure 4:
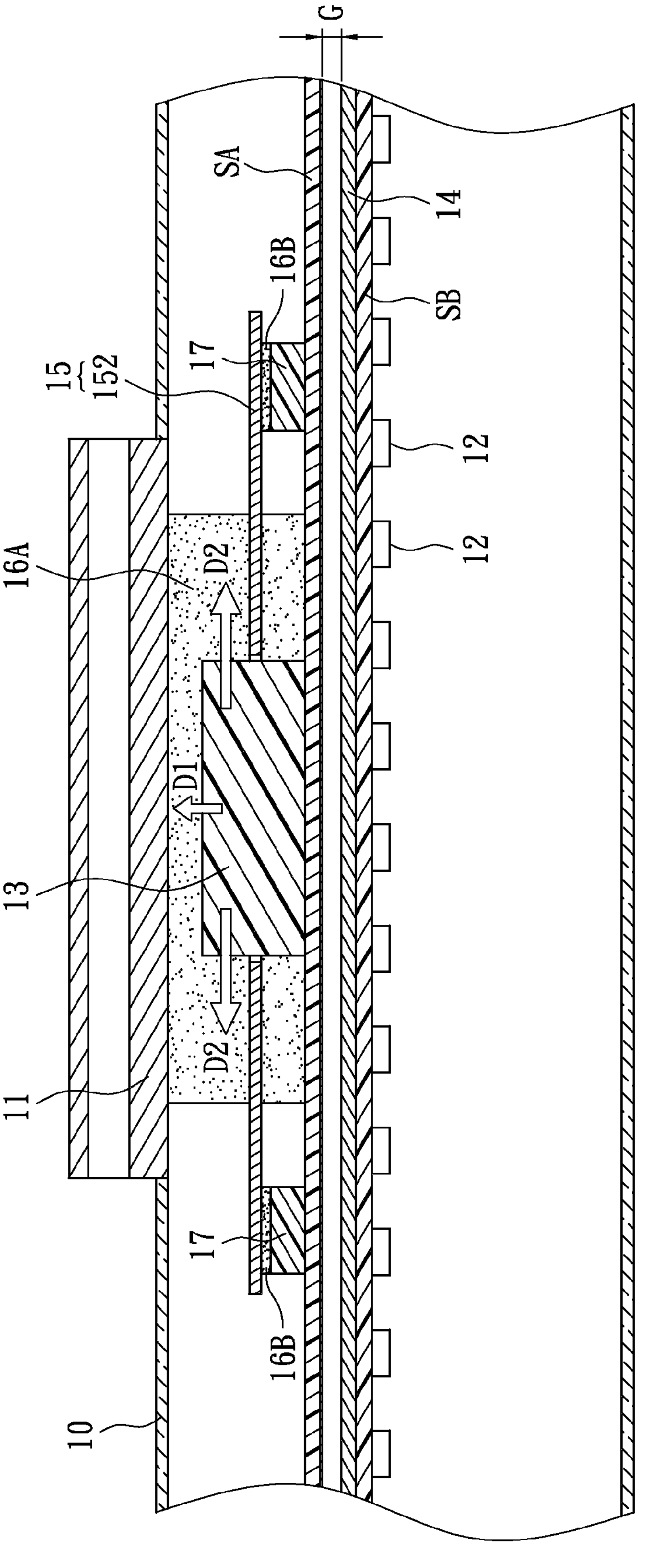
FIG. 4 is a side view of FIG. 3.

Please refer to FIGS. 3-4, which shows a tube for a third embodiment of the present invention. In this embodiment, the secondary heat-dissipating member 15 and the first heat-conducting material 16A are structurally different from the previous embodiments. Specifically, the secondary heat-dissipating member 15 is a one-piece plate, which can be mounted to the first electronic component 13 by the first heat-conducting material 16A. In addition, the secondary heat-dissipating member 15 can extend longitudinally away from the first electronic component 13. For example, as shown in FIGS. 3A and 4, the secondary heat-dissipating member 15 has a thru slot 151 formed thereon centrally. With the thru slot 151, the secondary heat-dissipating member 15 can be fitted over the first electronic component 13. The first electronic component 13 and the thru slot 151 are then covered with the first heat-conducting material 16A, to secure the secondary heat-dissipating member 15 to the first electronic component 13. The secondary heat-dissipating member 15 further has two side portions 152 and two connecting portions 153 defined thereon. The two side portions 152 are arranged on opposite sides of the thru slot 151 in the lengthwise direction and bridged by the connecting portions 153. Each side portion 152 of the secondary heat-dissipating member 15 is arranged adjacently to the corresponding side portion of the first electronic component 13. Therefore, the first electronic component 13 is coupled to the side portions 152 and the connection portions 153 of the secondary heat-dissipating member 15 by the first heat-conducting material 16A. The extended side portions 152 of the secondary heat-dissipating member 15 add additional heat-dissipating path to the first electronic component 13. As a result, the second heat-dissipating path D2 for the first electronic component 13 is formed through the first heat-conducting material 16A and the two side portions 152. As illustrated in FIG. 4, the second heat-dissipating path D2 is parallel to the longitudinal axis of the tube body 10. In other words, the second heat-dissipating path D2 is formed by the two side portions 152 of the secondary heat-dissipating member 15. Meanwhile, heat generated by the first electronic component 13 can also be conducted to the carrier 14 by the first heat-conducting material 16A and the two connecting portions 153. Such type of heat transfer provides a third heat-dissipating path D3. With the third heat-dissipating path D3, the generated heat by the first electronic component 13 is thermally conducted to the carrier 14 for heat dissipation through the first heat-conducting material 16A and the secondary heat-dissipating member 15. Likewise, in this embodiment, the heat generated by the second electronic components 17 can be dissipated through the heat-dissipating path defined by the secondary heat-dissipating member 15 and the second heat-conducting material 16B.

To summarize, three heat-dissipating paths in different directions are provided by this embodiment. Namely, the first, second, and third heat-dissipating paths D1, D2, and D3. For the first heat-dissipating path D1, the first electronic component 13 is covered with the first heat-conducting material 16A except its bottom surface. Since the first heat-conducting material 16A is also in contact with the inner surface of the heat-dissipating member 11, the heat generated by the first electronic component 13 can be dissipated through the first heat-conducting material 16A and the heat-dissipating member 11. Direction wise, the first heat-dissipating path D1 is normal to the longitudinal axis of the tube body 10 and is directed toward the opening 101. The heat would propagate in the positive x—direction as shown in FIG. 3A. For the second heat-dissipating path D2, the first electronic component 13 is connected to the secondary heat-dissipating member 15 via the first heat-conducting material 16A. Therefore, heat can be dissipated through the side portions 152 of the secondary heat-dissipating member 15. As shown in FIG. 4, this second heat-dissipating path D2 runs parallel to the longitudinal axis of the tube body 10. FIG. 3A also illustrates this second heat-dissipating path D2, which is directed along the Y-axis and the lengthwise direction of the secondary heat-dissipating member 15. Moreover, heat can be dissipated from the first electronic component 13 to the carrier 14 via the first heat-conducting material 16A and the secondary heat-dissipating member 15. This type of heat conduction forms the third heat-dissipating path D3. The third heat-dissipating path D3 runs normal to the longitudinal axis of the tube body 10. This third path is indicated by the z-axis in FIG. 3A, which is along the crosswise direction of the secondary heat-dissipating member 15. Thereby, heat generated by the first electronic component 13 can be dissipated out of the tube body 10. In particular, the second heat-dissipating path D2 prevents heat aggregation along the tube body 10.

The descriptions below will discuss the major assembling stages of the tube in accordance with the present invention. First, the carrier 14, the first circuit board SA having the aforementioned first electronic component 13 and the second electronic components 17, and the second circuit board SB having the light-emitting module 12 are assembled into the interior of the tube body 10. The first electronic component 13 is arranged correspondingly to the opening 101 of the tube body 10. Next, a mold is used to dispose the first heat-conducting material 16A around the first electronic component 13. The first heat-conducting material 16A is preferably a resin with higher thermal conductivity (k), such as an epoxy resin having a thermal conductivity of 0.03 W/m-K. Suitable choices for the first heat-conducting material 16A may also include thermal conductive clay (k=3.1 W/m-K) or any other material having an appropriate thermal conductivity. Then, the secondary heat-dissipating member 15 is mounted with the first electronic component 13. The secondary heat-dissipating member 15 extends in a symmetrical fashion from the first electronic component 13 along the longitudinal axis of the of the tube body 10. Then, the mold is used again to cover the first electronic component 13 with the first heat-conducting material 16*a*. As can be seen in FIG. 3, the secondary heat-dissipating member 15 is also covered by the first heat-conducting material 16*a*. The heat-conducting material used to cover the first electronic component 13 may be the same or is different from the heat-conducting material that was initially disposed around the first electronic component 13. Lastly, the heat-dissipating member 11 is assembled onto the tube body 10 to cover the opening 101. The inner surface of the heat-dissipating member 11 is in physical contact with the first heat-conducting material 16*a*. Thereby, the first heat-conducting material 16*a* can dissipate heat generated by the first electronic component 13 effectively, in order to prevent the heat aggregation inside the tube body 10. Consequently, excessive temperature variation along different regions of the tube can be avoided.

On the other hand, the heat dissipation efficiency also depends on the size of the heat-dissipating area of the heat-dissipating member 11. The following descriptions are based on the longitudinal direction of the tube 10. Namely, for the aforementioned embodiments, the length of the heat-dissipating member 11 is preferably two or three times of the length of the first electrical member 13. For the second and third embodiments, the secondary heat-dissipating member 15 is preferably twice as long as the heat-dissipating member 11.

Based on the above, the use of the heat-dissipating member 11, the secondary heat-dissipating member 15, and the first heat-conducting material 16*a* form various heat-dissipating paths. These paths help to cool the electronic component that produces most heat on the driving circuit. Thereby, excessive temperature variation along the tube can be resolved.

The tube of the present invention has several advantages. First, the temperature of the electronic component that produces most heat on the driving circuit can be reduced. For example, testing result shows the temperature of a transformer inside a conventional tube is approximately 125 deg. Celsius, while the same transformer inside of the tube of the present invention has a lower temperature at 100 deg. Celsius. Secondly, the lowering of electronic component temperature allows the overall temperature of the tube to be more uniform along the tube shaft direction. With the temperature being more uniform along the tube shaft direction, the light distribution from the light-emitting module is also more uniform. The service life of the tube is also extended.

The descriptions illustrated supra set forth simply the preferred embodiments of the present invention; however, the characteristics of the present invention are by no means restricted thereto. All changes, alternations, or modifications conveniently considered by those skilled in the art are deemed to be encompassed within the scope of the present invention delineated by the following claims.

What is claimed is:

1. A tube, comprising:
a tube body having at least one opening formed thereon;
at least one heat-dissipating member disposed on the opening of the tube body;
a carrier arranged in the tube body;
a light-emitting module arranged on one side of the carrier;
a first electronic component electrically connected to the light-emitting module and arranged on the other side of the carrier corresponding to the opening; and
a first heat-conducting material substantially covering the first electronic component and contacted with an inner surface of the heat-dissipating member;
wherein the first electronic component is thermally coupled to the heat-dissipating member via the first heat-conducting material;
wherein the coupling of the first electronic component, the first heat-conducting material, and the heat-dissipating member forms a first heat-dissipating path for heat dissipation.

2. The tube of claim 1, further comprising:
a first circuit board carried with the first electronic component and arranged on the other side of the carrier, the other side and the opening being on the same side of the carrier.

3. The tube of claim 2, the carrier further comprising
a plurality of protruded structures formed on the other side of the carrier;

wherein the first circuit board is supported abuttingly by the protruded structures in forming a clearance between the other side and the first circuit board.

4. The tube of claim 2, the other side of the carrier further comprising:

a pair of positioning members formed thereon for retaining the first circuit board.

5. The tube of claim 1, further comprising a second circuit board carried with the light-emitting module and arranged on the one side of the carrier, the one side facing away from the opening.

6. The tube of claim 1, further comprising a secondary heat-dissipating member arranged adjacently to the first electronic component, wherein the first electronic component is coupled to the secondary heat-dissipating member by the first heat-conducting material for heat dissipation.

7. The tube of claim 6, wherein the length of the heat-dissipating member along a tube shaft direction of the tube body is two to three times longer than that of the first electronic component; wherein the length of the secondary heat-dissipating member along the tube shaft direction of the tube body is twice as long as that of the heat-dissipating member.

8. The tube of claim 6, further comprising at least one second electronic component disposed on the first circuit board and shielded by the secondary heat-dissipating member, wherein a second heat-conducting material is used to couple the second electronic component and the secondary heat-dissipating member for heat dissipation.

9. The tube of claim 6, the secondary heat-dissipating member comprising:

a metal plate having a thru slot formed thereon, wherein the thru slot is provided for fitting to the first electronic component, the thru slot and the first electronic component is covered by the first heat-conducting material.

10. The tube of claim 9, the metal plate further comprising:

two side portions arranged symmetrically to the first electronic component, the first electronic component being coupled to the side portions via the first heat-conducting material, wherein a second heat-dissipating path is defined by the coupling of the first electronic component with the side portions of the secondary heat-dissipating member via the first heat-conducting material.

11. The tube of claim 10, wherein the two side portions are arranged symmetrically to the first electronic component along a tube shaft direction of the tube body, or along a radial direction of the tube body.

12. The tube of claim 10, the metal plate further comprising:

at least one connecting portion connected to the two side portions, the first electronic component being coupled to the connecting portion by the first heat-conducting material;

wherein a third heat-dissipating path is defined by the coupling of the first electronic component with the connecting portion of the secondary heat-dissipating member via the first heat-conducting material.

13. The tube of claim 12, wherein the one connection portion is arranged adjacently to the first electronic component along a tube shaft direction of the tube body, or along a radial direction of the tube body.

14. The tube of claim 6, the secondary heat-dissipating member further comprising:

a pair of metallic strips arranged adjacently to opposite sides of the first electronic component in a symmetrical manner, the first electronic component being coupled to the metallic strips by the first heat-conducting material, wherein a second heat-dissipating path is defined by the coupling of the first electronic component with the metallic strips through the first heat-conducting material.

15. The tube of claim 14, wherein the pair of metallic strips are arranged symmetrically to the first electronic component along a tube shaft direction of the tube body, or along a radial direction of the tube body.

16. The tube of claim 6, the secondary heat-dissipating member further comprising:

a metallic strip arranged adjacently to the first electronic component, the first electronic component being coupled to the metallic strip by the first heat-conducting material, wherein a second heat-dissipating path is defined by the coupling of the first electronic component with the metallic strip through the first heat-conducting material.

17. The tube of claim 16, wherein the metallic strip is arranged adjacently to the first electronic component along a tube shaft direction of the tube body, or along a radial direction of the tube body.

18. The tube of claim 1, wherein a plurality of fins are formed on an outer surface of the heat-dissipating member.

19. The tube of claim 1, the heat dissipating member further comprising:

a supporting member having a ring-like structure for supporting weight of the tube.

20. The tube of claim 1, wherein length of the heat-dissipating member along a tube shaft direction of the tube body is two to three times longer than that of the first electronic component.

* * * * *